(12) United States Patent
Hu (10) Patent No.: US 10,347,662 B2
(45) Date of Patent: Jul. 9, 2019

(54) ARRAY SUBSTRATE, MANUFACTURING METHOD THEREOF, AND DISPLAY PANEL

(71) Applicant: Shenzhen China Star Optoelectronics Technology Co., Ltd., Shenzhen, Guangdong (CN)

(72) Inventor: Xiaobo Hu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/558,688

(22) PCT Filed: Jun. 22, 2017

(86) PCT No.: PCT/CN2017/089582
§ 371 (c)(1),
(2) Date: Sep. 15, 2017

(87) PCT Pub. No.: WO2018/209754
PCT Pub. Date: Nov. 22, 2018

(65) Prior Publication Data
US 2018/0337199 A1 Nov. 22, 2018

(30) Foreign Application Priority Data
May 19, 2017 (CN) .......................... 2017 1 0362475

(51) Int. Cl.
*H01L 27/12* (2006.01)
*H01L 29/24* (2006.01)
(Continued)

(52) U.S. Cl.
CPC ........ *H01L 27/1225* (2013.01); *H01L 27/127* (2013.01); *H01L 27/1288* (2013.01); *H01L 29/24* (2013.01); *H01L 29/66969* (2013.01); *H01L 29/7869* (2013.01); *H01L 29/78618* (2013.01); *H01L 29/78633* (2013.01); *G02F 1/1368* (2013.01); *G02F 2202/10* (2013.01)

(58) Field of Classification Search
None
See application file for complete search history.

(56) References Cited

U.S. PATENT DOCUMENTS

9,082,857 B2 * 7/2015 Yamazaki ........... H01L 29/4908
9,312,146 B2 * 4/2016 Kong ................. H01L 29/42384
(Continued)

*Primary Examiner* — Chandra Chaudhari
(74) *Attorney, Agent, or Firm* — Andrew C. Cheng (57) ABSTRACT

The present disclosure discloses an array substrate comprising: a substrate; a gate electrode; a gate insulating layer formed on one side of the substrate facing the gate electrode, the gate insulating layer covering the gate electrode; an active layer formed on one side of the gate insulating layer away from the gate electrode and made of an indium gallium zinc tin oxide material; an ohmic contact layer formed on one side of the active layer away from the gate insulating layer and made of a conductive indium gallium zinc oxide material, the ohmic contact layer covering both ends of the active layer; and a source electrode and a drain electrode formed on one side of the ohmic contact layer away from the active layer, the source electrode and the drain electrode being electrically connected to both ends of the active layer by the ohmic contact layer, respectively.

12 Claims, 5 Drawing Sheets (51) Int. Cl.
  *H01L 29/786* (2006.01)
  *H01L 29/66* (2006.01)
  *G02F 1/1368* (2006.01)

(56) References Cited

U.S. PATENT DOCUMENTS 9,515,118 B2 * 12/2016 Jun .................... H01L 27/14663
2010/0025676 A1 * 2/2010 Yamazaki ......... H01L 29/78618
                                                         257/43

* cited by examiner

ARRAY SUBSTRATE, MANUFACTURING METHOD THEREOF, AND DISPLAY PANEL

CROSS REFERENCE TO RELATED APPLICATIONS

This application claims priority to Patent Application No. 201710362475.9, entitled "Array Substrate, Manufacturing Method Thereof, and Display Panel", filed on May 19, 2017, the disclosure of which is incorporated herein by reference in its entirety.

FIELD OF THE INVENTION

The present disclosure relates to the field of display panel, in particular to an array substrate, a manufacturing method thereof, and a display panel.

BACKGROUND OF THE INVENTION

With the development of display technology, flat display devices like liquid crystal display (LCD) having advantages of high picture quality, energy saving, slim design and wide range of applications, are widely used in mobile phones, televisions, personal digital assistants, digital cameras, laptops, desktop computers and other consumer electronics products, thereby becoming the predominant display devices.

Most of the liquid crystal display devices on the market are back light type liquid crystal displays, which comprise liquid crystal display panels and back light modules. A liquid crystal display panel is composed of a color filter (CF) substrate, a thin film transistor (TFT) array substrate, liquid crystal (LC) sandwiched between the color film substrate and the array substrate, and a sealant frame. Among them, the performance of the thin film transistors of the array substrate directly affects the display quality of the liquid crystal display panel.

A thin film transistor using indium gallium zinc oxide (IGZO) semiconductor is provided with high mobility, thereby reducing the power consumption and cost of the liquid crystal display panels, and improving the resolution of the liquid crystal display panels to achieve full HD, and even to ultra definition (4 k*2 k) level. For that reason, such thin film transistor has received extensive attention and has been widely used. However, as the indium gallium zinc oxide semiconductor is sensitive to most of the acidic etchant and is easily corroded during wet etching, resulting in poor performance of the device.

SUMMARY OF THE INVENTION

The technical problem to be solved by the present disclosure is to provide an array substrate with good device performance.

Additionally, a display panel using the array substrate is provided.

Furthermore, a method for manufacturing array substrate is also provided.

In order to achieve the above goal, the embodiments of the present disclosure adopt the following technical solutions.

In one aspect, the present disclosure provides an array substrate comprising:
 a substrate;
 a gate electrode formed on the substrate;
 a gate insulating layer formed on one side of the substrate facing the gate electrode, the gate insulating layer covering the gate electrode;
 an active layer formed on one side of the gate insulating layer away from the gate electrode and made of an indium gallium zinc tin oxide material;
 an ohmic contact layer formed on one side of the active layer away from the gate insulating layer and made of a conductive indium gallium zinc oxide material, the ohmic contact layer covering both ends of the active layer; and
 a source electrode and a drain electrode which are separate from each other formed on one side of the ohmic contact layer away from the active layer, the source electrode and the drain electrode being electrically connected to both ends of the active layer by the ohmic contact layer, respectively.

Hereinto, the ohmic contact layer comprises a first ohmic contact block and a second ohmic contact block which are arranged at intervals. The first ohmic contact block covers one end of the active layer and is connected to the source electrode. The second ohmic contact block covers the other end of the active layer and is connected to the drain electrode.

Hereinto, the thickness of the active layer is greater than or equal to 400 Å and is less than or equal to 1000 Å, and the thickness of the ohmic contact layer is less than or equal to 500 Å.

Hereinto, the array substrate further comprises:
 a passivation layer covering the source electrode, the drain electrode and the active layer, the passivation layer being provided with a via hole for exposing a portion of the drain electrode; and
 a pixel electrode formed on one side of the passivation layer away from the source electrode, the pixel electrode being connected to the drain electrode through the via hole.

In another aspect, the present disclosure provides a display panel comprising the aforementioned array substrate.

In another aspect, the present disclosure provides a method for manufacturing an array substrate, comprising:
 forming a gate electrode on a substrate;
 forming a gate insulating layer on one side of the substrate facing the gate electrode, the gate insulating layer covering the gate electrode;
 depositing an indium gallium zinc tin oxide layer and an indium gallium zinc oxide layer sequentially on one side of the gate insulating layer away from the gate electrode;
 treating the indium gallium zinc oxide layer by a conductivity treatment to form a conductive indium gallium zinc oxide layer;
 depositing a metal layer on one side of the conductive indium gallium zinc oxide layer away from the indium gallium zinc tin oxide layer;
 removing a portion of the metal layer, a portion of the conductive indium gallium zinc oxide layer and a portion of the indium gallium zinc tin oxide layer by a mask process to form an active layer;
 removing a portion of the metal layer and a portion of the conductive indium gallium zinc oxide layer by a wet etching process to form an ohmic contact layer, and a source electrode and a drain electrode which are separate from each other, the ohmic contact layer covering both ends of the active layer, the source electrode and the drain electrode being electrically connected to both ends of the active layer by the ohmic contact layer, respectively.

Hereinto, the conductivity treatment is one of a plasma treatment method, an ion implantation treatment method, an ultraviolet light irradiation treatment method and a microwave treatment method.

Hereinto, the over-etching amount of the wet etching process is greater than 20%.

Hereinto, the mask process uses a half tone mask.

Hereinto, the method for manufacturing the array substrate further comprises:

forming a passivation layer on one side of the source electrode away from the gate insulating layer, the passivation layer covering the source electrode, the drain electrode and the active layer simultaneously, the passivation layer being provided with a via hole for exposing a portion of the drain electrode; and forming a pixel electrode on one side of the passivation layer away from the source electrode, the pixel electrode being connected to the drain electrode through the via hole.

Compared with the related art, the present disclosure has the following beneficial effects.

The gate electrode, the gate insulating layer, the active layer, the ohmic contact layer, the source electrode and the drain electrode according to the present disclosure form a thin film transistor with a back channel etch type structure. As the ohmic contact layer is made of the conductive indium gallium zinc oxide material, and the active layer is made of the indium gallium zinc tin oxide material, when a patterned source electrode and a patterned drain electrode are formed by a wet etching process, a patterned ohmic contact layer is formed at the same time. Further, the active layer can be prevent from being corroded by an acidic etchant, which may otherwise make the TFT defective, so that the array substrate has good device performance. As the conductive indium gallium zinc oxide material has conductor properties, and the ohmic contact layer has good electrical conductivity, thereby facilitating good conductive contact with the source electrode and the drain electrode, which not only reduces the contact resistance between the source electrode and the active layer and the contact resistance between the drain electrode and the active layer, but also reduces the risk of current leakage.

BRIEF DESCRIPTION OF THE DRAWINGS

In order to illustrate technical solutions of present disclosure more clearly, the drawings needed in the description of embodiments of present disclosure will be introduced briefly. Apparently, hereinafter described drawings are merely a portion of embodiments of present disclosure. For those skilled in the art, they can obtain other drawings on the base of these drawings without a creative work.

DETAILED DESCRIPTION OF ILLUSTRATED EMBODIMENTS

In order to make those skilled in the art understand the technical solutions of present disclosure better, clear and complete, description of the technical solutions of present disclosure will be illustrated, which combined with the drawings of embodiments in present disclosure. Apparently, described embodiments are merely a portion of embodiments of present disclosure, rather than all of the embodiments. Base on the embodiments of present disclosure, all other embodiments obtained by those skilled in the art without creative work are considered to be encompassed within the scope of the present disclosure.

Referring to FIGS. 1 to 10, embodiments of the present disclosure provide a display panel 100 which can be applied to various display devices. The display panel 100 comprises an array substrate 1, a color filter substrate 2 arranged opposite to the array substrate 1, and a liquid crystal layer 3 sandwiched between the array substrate 1 and the color filter substrate 2.

Figure 1:
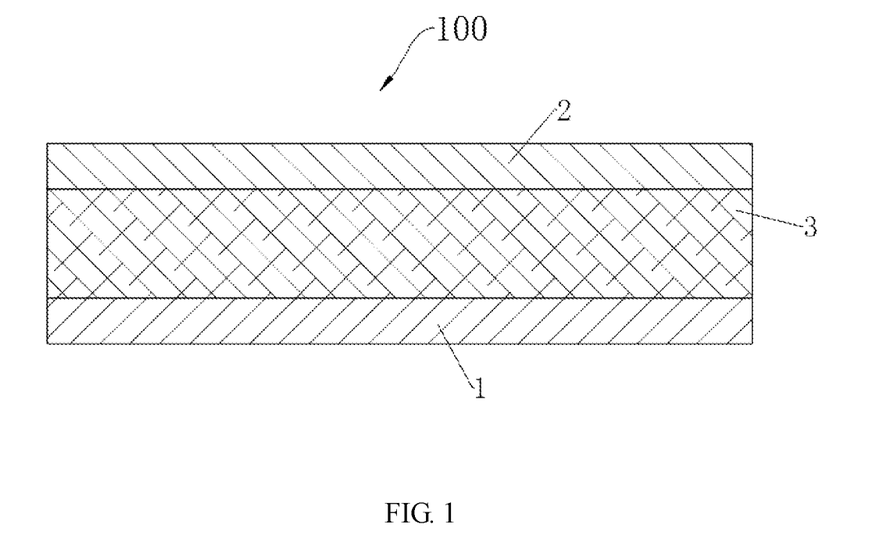
FIG. 1 is a schematic view illustrating a display panel according to some embodiments of the present disclosure.

The array substrate 1 comprises a substrate 11, a gate electrode 12, a gate insulating layer 13, an active layer 14, an ohmic contact layer 15, a source electrode 16, and a drain electrode 17. The gate electrode 12 is formed on the substrate 11. The gate insulating layer 13 is formed on one side of the substrate 11 facing the gate electrode 12 and covers the gate electrode 12. The active layer 14 is formed on one side of the gate insulating layer 13 away from the gate electrode 12 and is made of an indium gallium zinc tin oxide (IGZTO) material. The active layer 14 is arranged facing to the gate electrode 12 directly. The ohmic contact layer 15 is formed on one side of the active layer 14 away from the gate insulating layer 13. The ohmic contact layer 15 is made of a conductive indium gallium zinc oxide (IGZO) material and covers both ends of the active layer 14. The source electrode 16 and the drain electrode 17 are separate from each other and are formed on one side of the ohmic contact layer 15 away from the active layer 14. The source electrode 16 and the drain electrode 17 are electrically connected to both ends of the active layer 14 by the ohmic contact layer 15, respectively.

In this embodiment, the gate electrode 12, the gate insulating layer 13, the active layer 14, the ohmic contact layer 15, the source electrode 16 and the drain electrode 17 form a thin film transistor with a back channel etch (BCE) type structure. As the ohmic contact layer 15 is made of the conductive indium gallium zinc oxide material, and the active layer 14 is made of the indium gallium zinc tin oxide material, when a patterned source electrode 16 and a patterned drain electrode 17 are formed by a wet etching process, a patterned ohmic contact layer 15 is formed at the same time. Further, the active layer 14 can be prevent from being corroded by an acidic etchant, which may otherwise make the TFT defective, so that the array substrate 1 has good device performance. As the conductive indium gallium zinc oxide material has conductor properties, and the ohmic contact layer 15 has good electrical conductivity, thereby facilitating good conductive contact with the source electrode 16 and the drain electrode 17, which not only reduces the contact resistance between the source electrode 16 and the active layer 14 and the contact resistance between the drain electrode 17 and the active layer 14, but also reduces the risk of current leakage.

Understandably, the orthographic projection of the active layer 14 on the substrate 11 covers the gate electrode 12.

Optionally, the ohmic contact layer 15 comprises a first ohmic contact block 151 and a second ohmic contact block 152 which are arranged at intervals. The first ohmic contact block 151 covers one end of the active layer 14 and is connected to the source electrode 16. The second ohmic contact block 152 covers the other end of the active layer 14 and is connected to the drain electrode 17.

Further, the orthographic projection of the first ohmic contact block 151 on the active layer 14 covers the orthographic projection of the source electrode 16 on the active layer 14, thereby providing a reliable electrical conductivity. The orthographic projection of the second ohmic contact block 152 on the active layer 14 covers the orthographic projection of the drain electrode 17 on the active layer 14, thereby providing a reliable electrical conductivity.

Optionally, the thickness of the active layer 14 is greater than or equal to 400 Å and is less than or equal to 1000 Å. When the thickness of the active layer 14 made of the indium gallium zinc tin oxide material satisfies the aforementioned conditions, the device performance of the thin film transistor is great. When the thickness of the active layer 14 is less than 400 Å or greater than 1000 Å, the device performance of the thin film transistor is gradually reduced.

The thickness of the ohmic contact layer 15 is less than or equal to 500 Å. When the ohmic contact layer 15 made of the conductive indium gallium zinc oxide material satisfies the aforementioned conditions, the contact resistance between the source electrode 16 and the active layer 14 and the contact resistance between the drain electrode 17 and the active layer 14 can be effectively reduced.

Optionally, the gate electrode 12 is made of a metal material having excellent electrical conductivity and good light-shielding property. The gate electrode 12 is capable of blocking light to prevent light from entering the active layer 14 of the thin film transistor, so that the thin film transistor has good electrical stability and the array substrate 1 has good device performance.

The material of the gate electrode 12 can be one or a stacked combination of molybdenum (Mo), aluminum (Al), copper (Cu), and titanium (Ti).

Optionally, the gate insulating layer 13 is made of a silicon oxide ($SiO_2$) material.

Optionally, the source electrode 16 and the drain electrode 17 are both made of a stacked combination of aluminum (Al) and molybdenum (Mo).

As an alternative embodiment, the array substrate 1 further comprises a passivation layer (PV) 18 and a pixel electrode 19. The passivation layer 18 is formed on one side of the source electrode 16 away from the ohmic contact layer 15, and covers the source electrode 16, the drain electrode 17 and the active layer 14. The passivation layer 18 is provided with a via hole 181 for exposing a portion of the drain electrode 17. The pixel electrode 19 is formed on one side of the passivation layer 18 away from the source electrode 16 and is connected to the drain electrode 17 through the via hole 181.

Optionally, the passivation layer 18 is made of a silicon oxide ($SiO_2$) film or a composite film of silicon oxide ($SiO_2$) and silicon nitride (SiNx). The silicon oxide film is close to the active layer 14, and the silicon nitride film is remote from the active layer 14. The pixel electrode 19 is made of an indium tin oxide (ITO) material.

Figure 2:
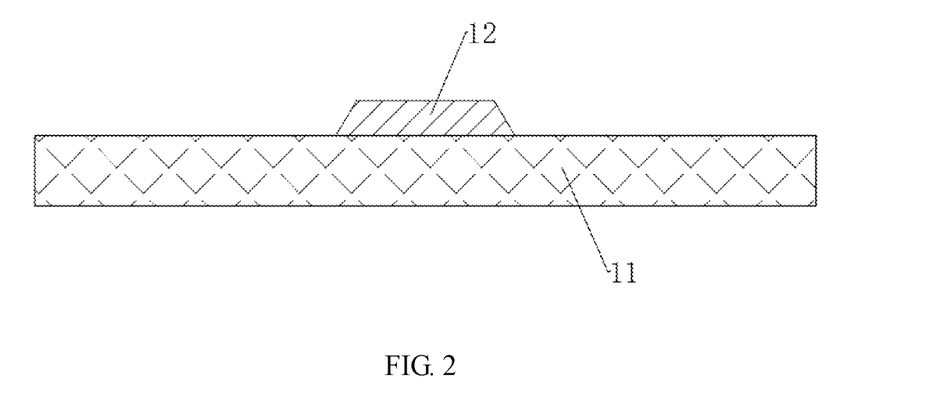
FIG. 2 is a schematic view corresponding to the step S01 of a method for manufacturing an array substrate according to some embodiments of the present disclosure.
Figure 3:
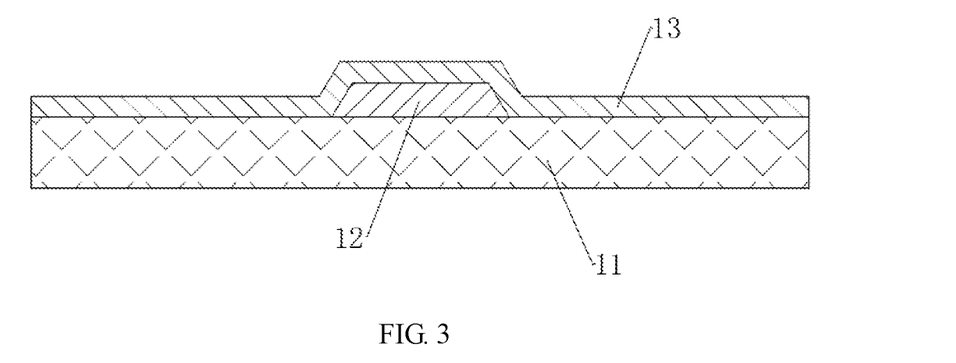
FIG. 3 is a schematic view corresponding to the step S02 of a method for manufacturing an array substrate according to some embodiments of the present disclosure.
Figure 4:
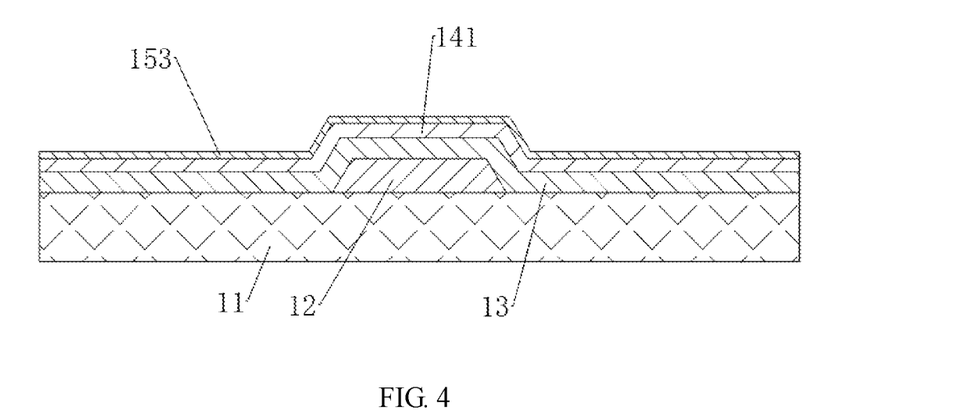
FIG. 4 is a schematic view corresponding to the step S03 of a method for manufacturing an array substrate according to some embodiments of the present disclosure.
Figure 5:
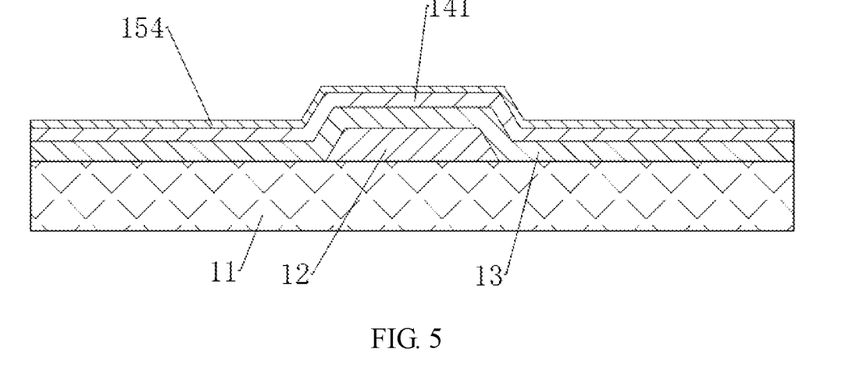
FIG. 5 is a schematic view corresponding to the step S04 of a method for manufacturing an array substrate according to some embodiments of the present disclosure.
Figure 6:
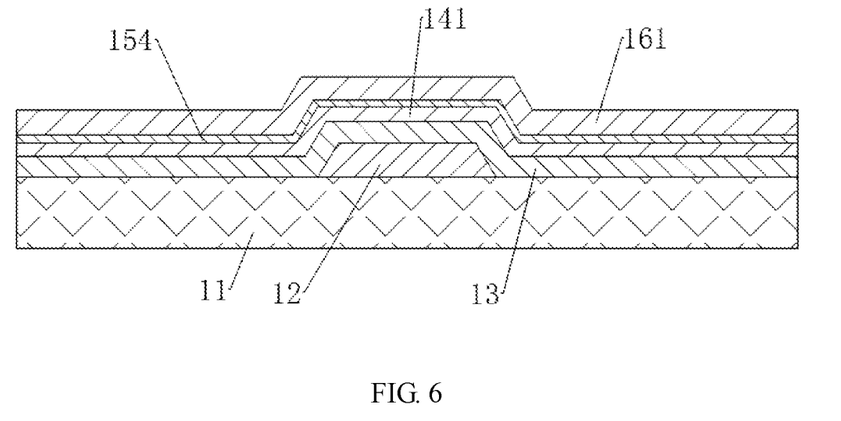
FIG. 6 is a schematic view corresponding to the step S05 of a method for manufacturing an array substrate according to some embodiments of the present disclosure.
Figure 7:
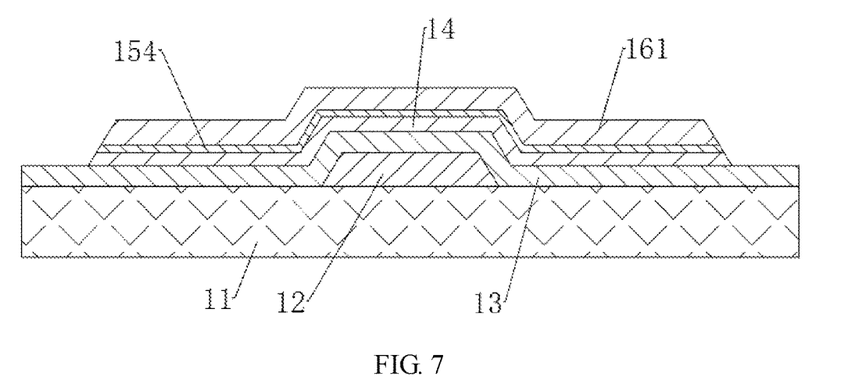
FIG. 7 is a schematic view corresponding to the step S06 of a method for manufacturing an array substrate according to some embodiments of the present disclosure.
Figure 8:
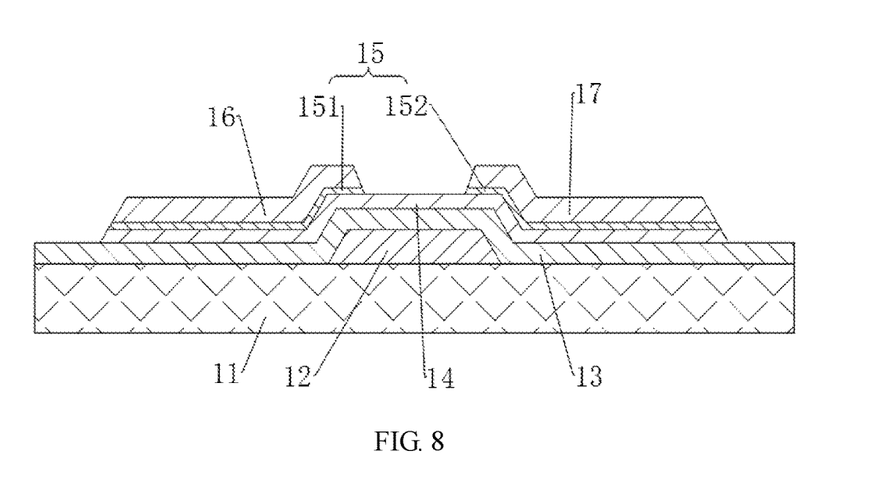
FIG. 8 is a schematic view corresponding to the step S07 of a method for manufacturing an array substrate according to some embodiments of the present disclosure.

Referring to FIGS. 2 to 10, the embodiments of the present disclosure also provide a method for manufacturing an array substrate for producing the array substrate 1 described in the above embodiment. The method for manufacturing the array substrate comprises:

S01, forming a gate electrode 12 on a substrate 11;

S02, forming a gate insulating layer 13 on one side of the substrate 11 facing the gate electrode 12, the gate insulating layer 13 covering the gate electrode 12;

S03, depositing an indium gallium zinc tin oxide layer 141 and an indium gallium zinc oxide layer 153 sequentially on one side of the gate insulating layer 13 away from the gate electrode 12, at this point, the indium gallium zinc tin oxide layer 141 being positioned between the gate insulating layer 13 and the indium gallium zinc oxide layer 153;

S04, treating the indium gallium zinc oxide layer 153 by a conductivity treatment to form a conductive indium gallium zinc oxide layer 154;

S05, depositing a metal layer 161 on one side of the conductive indium gallium zinc oxide layer 154 away from the indium gallium zinc tin oxide layer 141;

S06, removing a portion of the metal layer 161, a portion of the conductive indium gallium zinc oxide layer 154 and a portion of the indium gallium zinc tin oxide layer 141 by a mask process to form an active layer 14;

S07, removing a portion of the metal layer 161 and a portion of the conductive indium gallium zinc oxide layer 154 by a wet etching process to form an ohmic contact layer 15, and a source electrode 16 and a drain electrode 17 which are separate from each other, the ohmic contact layer 15 covering both ends of the active layer 14, the source electrode 16 and the drain electrode 17 being electrically connected to both ends of the active layer 14 by the ohmic contact layer 15, respectively.

In this embodiment, as the ohmic contact layer 15 is obtained from the conductive indium gallium zinc oxide layer 154, and the active layer 14 is obtained from the indium gallium zinc tin oxide layer 141, therefore, the patterned ohmic contact layer 15, the patterned source electrode 16 and the patterned drain electrode 17 are simultaneously formed by a wet etching process in the step S07. Further, the active layer 14 can be prevent from being corroded by an acidic etchant, which may otherwise make the device defective, so that the array substrate 1 has good device performance. As the conductive indium gallium zinc oxide layer 154 is formed by the conductivity treatment in the step S04, therefore, the ohmic contact layer 15 formed in the step S07 has good electrical conductivity, thereby facilitating good conductive contact with the source electrode 16 and the drain electrode 17, which not only reduces the contact resistance between the source electrode 16 and the active layer 14 and the contact resistance between the drain electrode 17 and the active layer 14, but also reduces the risk of current leakage.

Optionally, in the step S03, the indium gallium zinc tin oxide layer 141 and the indium gallium zinc oxide layer 153 are deposited by a physical vapor deposition (PVD) method.

Optionally, in the step S04, the conductivity treatment is one of a plasma treatment method, an ion implantation treatment method, an ultraviolet light irradiation treatment method and a microwave treatment method.

Optionally, in the step S06, the mask process uses a half tone mask.

Optionally, prior to step S07, the residual photoresist is removed by an ashing treatment to ensure the yield of subsequent process steps.

Optionally, in the step S07, the over-etching amount of the wet etching process is greater than 20%, so that the conductive indium gallium zinc oxide layer 154 between the source electrode 16 and the drain electrode 17 can be completely etched, thereby improving the product yield of the array substrate 1.

Figure 9:
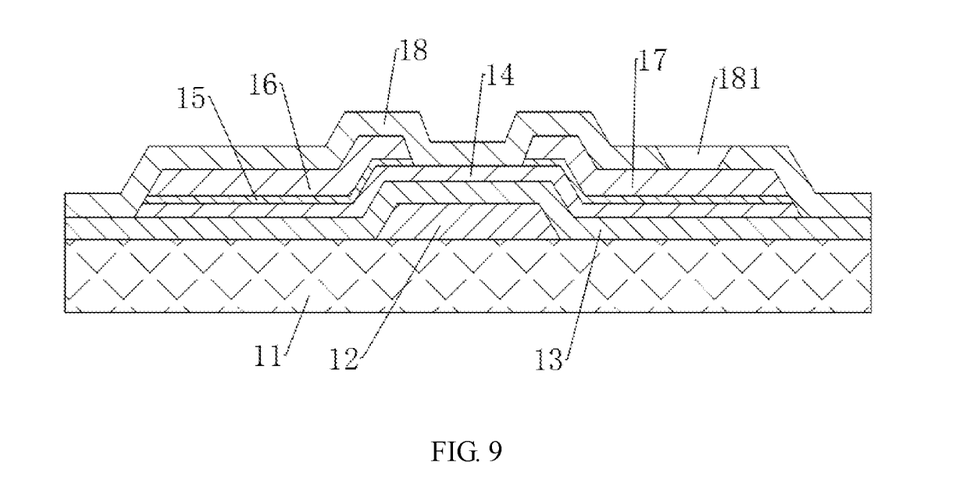
FIG. 9 is a schematic view corresponding to the step S08 of a method for manufacturing an array substrate according to some embodiments of the present disclosure.
Figure 10:
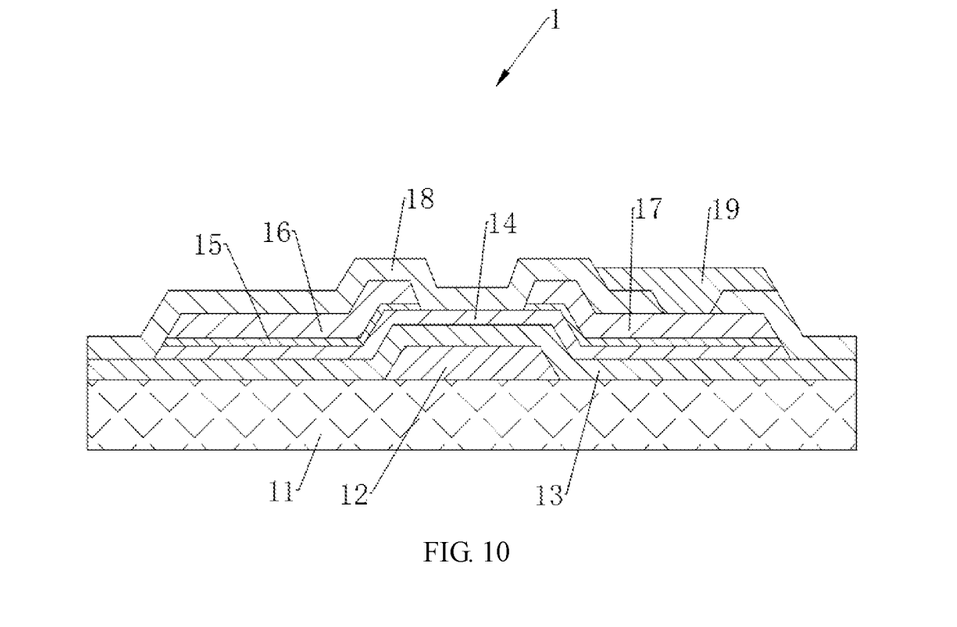
FIG. 10 is a schematic view corresponding to the step S09 of a method for manufacturing an array substrate according to some embodiments of the present disclosure.

As an alternative embodiment, the method for manufacturing the array substrate further comprises:

S08, forming a passivation layer 18 on one side of the source electrode 16 away from the gate insulating layer 13, the passivation layer 18 covering the source electrode 16, the drain electrode 17 and the active layer 14 simultaneously, the passivation layer 18 being provided with a via hole 181 for exposing a portion of the drain electrode 17;

S09, forming a pixel electrode 19 on one side of the passivation layer 18 away from the source electrode 16, the pixel electrode 19 being connected to the drain electrode 17 through the via hole 181 to form the array substrate 1.

In this embodiment, the thin film transistor with metal oxide back channel etch type structure provided with the ohmic contact layer is produced by the manufacturing method of array substrate with four mask process (specifically, S01, S06, S08, and S09). Compared with the manufacturing method of conventional metal oxide etch stop layer (ESL) type thin film transistors, the manufacturing method of the present disclosure reduces two mask processes. Therefore, the process steps of the manufacturing method of the array substrate are relatively simplified, and the cost is low.

It is to be understood that the foregoing description merely depicts some exemplary embodiments of the disclosure for the sole purpose of illustrating the principles of the disclosure, but the disclosure is not limited thereto. It would be apparent to those skilled in the art that various changes and modifications can be made therein without departing from the scope of the disclosure, and all these changes or modifications shall be considered to fall within the protection of the disclosure.

What is claimed is:

1. An array substrate comprising:
   a substrate;
   a gate electrode formed on the substrate;
   a gate insulating layer formed on one side of the substrate facing the gate electrode, the gate insulating layer covering the gate electrode;
   an active layer formed on one side of the gate insulating layer away from the gate electrode and made of an indium gallium zinc tin oxide material;
   an ohmic contact layer formed on one side of the active layer away from the gate insulating layer and made of a conductive indium gallium zinc oxide material, the ohmic contact layer covering two opposite end portions of the active layer; and
   a source electrode and a drain electrode which are separate from each other formed on one side of the ohmic contact layer away from the active layer, the source electrode and the drain electrode being electrically connected to both ends of the active layer by the ohmic contact layer, respectively,
   wherein the active layer is arranged on the gate insulating layer and the ohmic contact layer is arranged on the end portions of the active layer, such that the end portions of the active layer are sandwiched between the ohmic contact layer and the gate insulating layer.

2. The array substrate according to claim 1, wherein the ohmic contact layer comprises a first ohmic contact block and a second ohmic contact block which are arranged at intervals, the first ohmic contact block covering a first one of the end portions of the active layer and being connected to the source electrode, the second ohmic contact block covering a second one of the end portions of the active layer and being connected to the drain electrode.

3. The array substrate according to claim 2, wherein the thickness of the active layer is greater than or equal to 400 Å and is less than or equal to 1000 Å, and the thickness of the ohmic contact layer is less than or equal to 500 Å.

4. The array substrate according to claim 1, wherein the array substrate further comprises:
   a passivation layer covering the source electrode, the drain electrode and the active layer, the passivation layer being provided with a via hole for exposing a portion of the drain electrode; and
   a pixel electrode formed on one side of the passivation layer away from the source electrode, the pixel electrode being connected to the drain electrode through the via hole.

5. The array substrate according to claim 2, wherein the array substrate further comprises:
   a passivation layer covering the source electrode, the drain electrode and the active layer, the passivation layer being provided with a via hole for exposing a portion of the drain electrode; and
   a pixel electrode formed on one side of the passivation layer away from the source electrode, the pixel electrode being connected to the drain electrode through the via hole.

6. The array substrate according to claim 3, wherein the array substrate further comprises:
   a passivation layer covering the source electrode, the drain electrode and the active layer, the passivation layer being provided with a via hole for exposing a portion of the drain electrode; and
   a pixel electrode formed on one side of the passivation layer away from the source electrode, the pixel electrode being connected to the drain electrode through the via hole.

7. A display panel comprising an array substrate, the array substrate comprising:
   a substrate;
   a gate electrode formed on the substrate;
   a gate insulating layer formed on one side of the substrate facing the gate electrode, the gate insulating layer covering the gate electrode;
   an active layer formed on one side of the gate insulating layer away from the gate electrode and made of an indium gallium zinc tin oxide material;

an ohmic contact layer formed on one side of the active layer away from the gate insulating layer and made of a conductive indium gallium zinc oxide material, the ohmic contact layer covering two opposite end portions of the active layer; and a source electrode and a drain electrode which are separate from each other formed on one side of the ohmic contact layer away from the active layer, the source electrode and the drain electrode being electrically connected to both ends of the active layer by the ohmic contact layer, respectively, wherein the active layer is arranged on the gate insulating layer and the ohmic contact layer is arranged on the end portions of the active layer, such that the end portions of the active layer are sandwiched between the ohmic contact layer and the gate insulating layer.

8. The display panel according to claim 7, wherein the ohmic contact layer comprises a first ohmic contact block and a second ohmic contact block which are arranged at intervals, the first ohmic contact block covering a first one of the end portions of the active layer and being connected to the source electrode, the second ohmic contact block covering a second one of the end portions of the active layer and being connected to the drain electrode.

9. The display panel according to claim 8, wherein the thickness of the active layer is greater than or equal to 400 Å and is less than or equal to 1000 Å, and the thickness of the ohmic contact layer is less than or equal to 500 Å.

10. The display panel according to claim 7, wherein the array substrate further comprises:

a passivation layer covering the source electrode, the drain electrode and the active layer, the passivation layer being provided with a via hole for exposing a portion of the drain electrode; and a pixel electrode formed on one side of the passivation layer away from the source electrode, the pixel electrode being connected to the drain electrode through the via hole.

11. The display panel according to claim 8, wherein the array substrate further comprises:

a passivation layer covering the source electrode, the drain electrode and the active layer, the passivation layer being provided with a via hole for exposing a portion of the drain electrode; and a pixel electrode formed on one side of the passivation layer away from the source electrode, the pixel electrode being connected to the drain electrode through the via hole.

12. The display panel according to claim 9, wherein the array substrate further comprises:

a passivation layer covering the source electrode, the drain electrode and the active layer, the passivation layer being provided with a via hole for exposing a portion of the drain electrode; and a pixel electrode formed on one side of the passivation layer away from the source electrode, the pixel electrode being connected to the drain electrode through the via hole.

* * * * *